(12) United States Patent
Tu

(10) Patent No.: US 7,189,613 B2
(45) Date of Patent: Mar. 13, 2007

(54) METHOD AND STRUCTURE FOR METAL-INSULATOR-METAL CAPACITOR BASED MEMORY DEVICE

(75) Inventor: Kuo-Chi Tu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 11/064,894

(22) Filed: Feb. 23, 2005

(65) Prior Publication Data
US 2006/0189072 A1    Aug. 24, 2006

(51) Int. Cl.
*H01L 21/8242* (2006.01)
(52) U.S. Cl. .................. 438/241; 438/243; 438/244; 438/253; 438/386; 438/387; 438/396; 257/300; 257/303; 257/306; 257/516; 257/532
(58) Field of Classification Search ................ 438/210, 438/241, 250, 253, 393, 396, 220, 430, FOR. 220, 438/FOR. 430, 243, 244, 386, 387; 257/296, 257/300, 306, 516, 532, 301, 303
See application file for complete search history.

(56) References Cited

U.S. PATENT DOCUMENTS

| | | | | |
|---|---|---|---|---|
| 5,918,120 A | * | 6/1999 | Huang | 438/239 |
| 6,117,725 A | * | 9/2000 | Huang | 438/241 |
| 6,228,703 B1 | | 5/2001 | Chang | 438/241 |
| 6,232,197 B1 | | 5/2001 | Tsai | 438/393 |
| 6,339,495 B1 | | 1/2002 | Cowle et al. | 359/341.4 |
| 6,376,304 B1 | * | 4/2002 | Matsuoka et al. | 438/253 |
| 6,376,366 B1 | | 4/2002 | Lin et al. | 438/637 |
| 6,391,777 B1 | | 5/2002 | Chen et al. | 438/687 |
| 6,407,002 B1 | | 6/2002 | Lin et al. | 438/713 |
| 6,528,366 B1 | | 3/2003 | Tu et al. | 438/253 |
| 6,770,930 B2 | * | 8/2004 | Oashi | 257/306 |
| 2006/0011964 A1 | * | 1/2006 | Satou | 257/306 |

* cited by examiner

*Primary Examiner*—George Fourson
*Assistant Examiner*—Joannie Adelle Garcia
(74) *Attorney, Agent, or Firm*—Preston Gates & Ellis LLP

(57) ABSTRACT

A process for integrally fabricating a memory cell capacitor and a logic device is disclosed. A first conductive layer and second conductive layer are formed above a semiconductor substrate with a logic region and memory cell region. A first photoresist layer is formed to cover the logic region, and expose an inter-metal dielectric layer adjacent to the second conductive layer in the memory cell region. The exposed inter-metal dielectric layer is etched off to form an opening adjacent to the second conductive layer. A capacitor dielectric layer and third conductive layer are formed on inner walls of the opening to constitute a metal-insulator-metal capacitor.

25 Claims, 21 Drawing Sheets

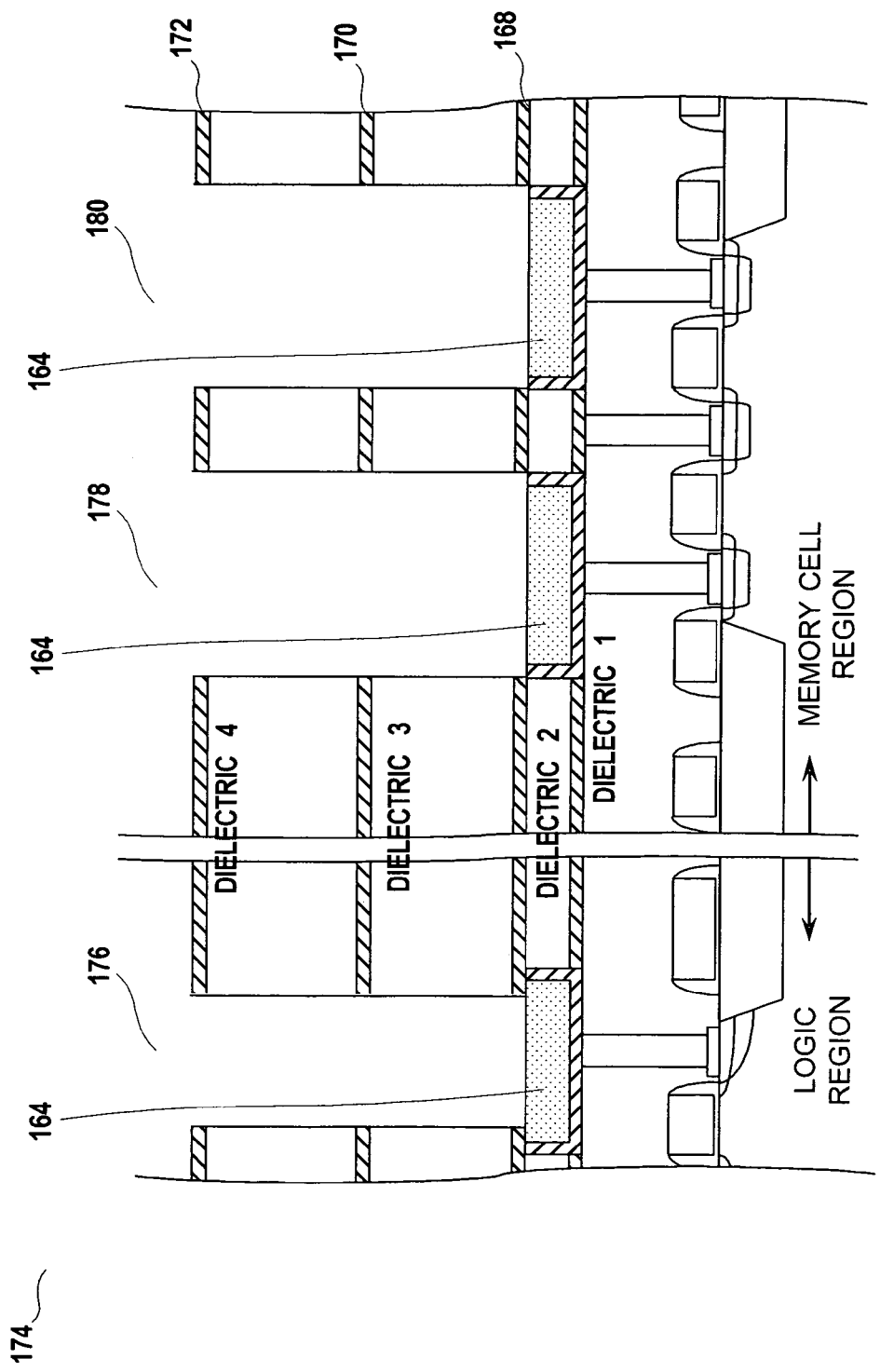

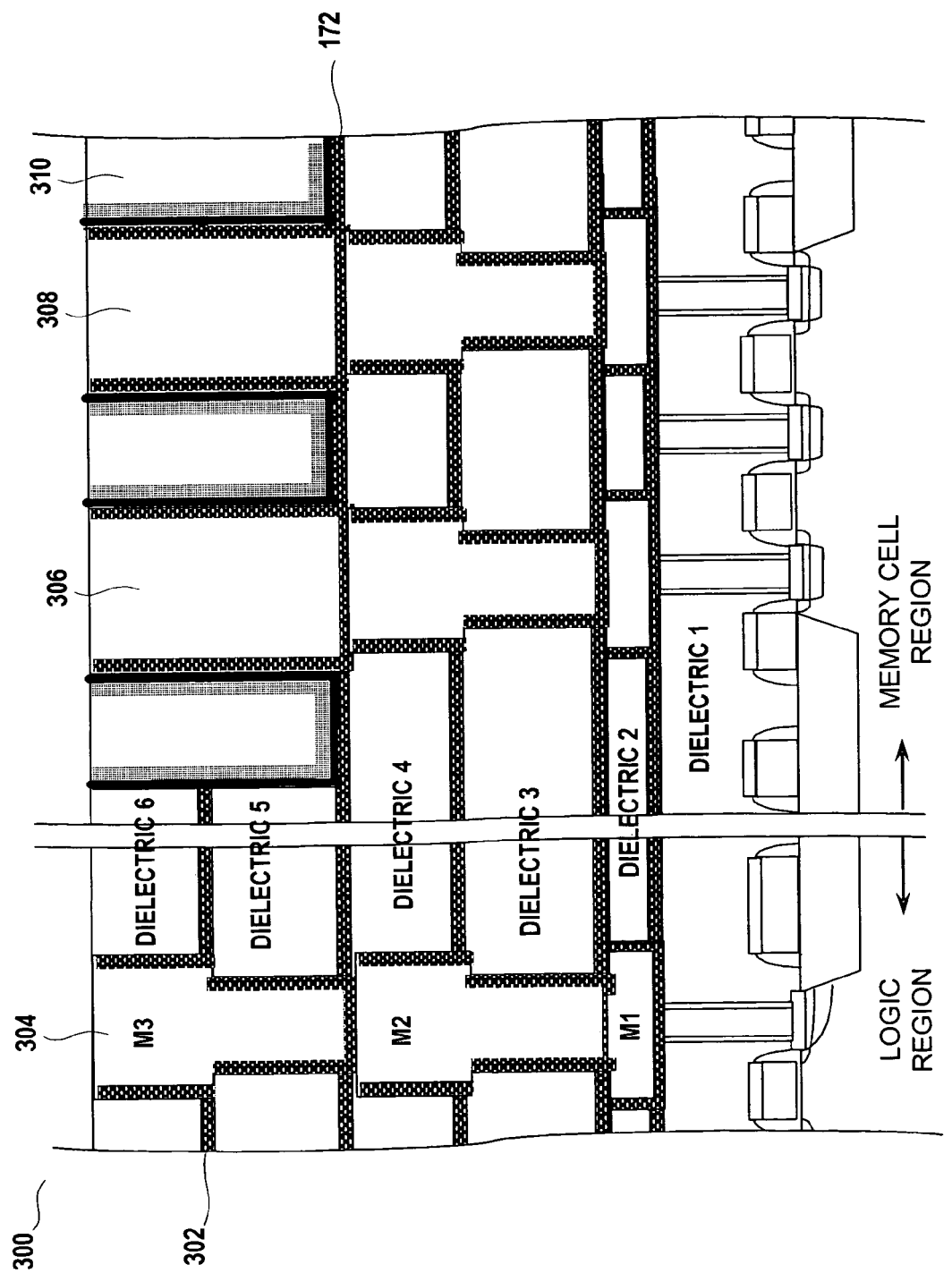

METHOD AND STRUCTURE FOR METAL-INSULATOR-METAL CAPACITOR BASED MEMORY DEVICE

BACKGROUND

The present invention relates generally to memory designs, and more particularly to an improved memory design that uses a process of fabricating a memory cell and a logic device.

Semiconductor dynamic random access memory (DRAM) design is a technology driver for much of the integrated circuit (IC) industry. Structures and process originated for DRAMs are applied widely. A DRAM element stores a bit of data in a capacitor that is accessed through a metal-oxide-semiconductor field-effect-transistor (MOSFET) that is switched by a word line. A bit of data is available to a MOSFET from a bit line. When the word line turns on a MOSFET, the data stored in the capacitor can be read through the bit line.

The layout of the circuit on the semiconductor chip and the design of the capacitors are strong determinants of the area efficiency, and therefore cost, of a DRAM chip. In semiconductor structure, DRAM capacitors have typically been either buried or stacked. Buried capacitors are usually placed in trenches in the semiconductor substrate. The deeper the trench, the more area its vertical surfaces have available for larger capacitance values. This still requires significant chip area. Stacked capacitors can be either polycrystalline silicon (poly) or metal-insulator-metal (MIM). The MIM capacitors are embedded in the oxide layers above the active surface of the chip.

A bit line contact reaches the active chip surface downward through a metal-filled contact via to a contact that is common to two MOSFETs. As one of the two MOSFETs is switched by a word line, the bit line can either write a bit to a capacitor that is attached to the other contact of the MOSFET or it can read a bit from the capacitor. So, the bit line contact is tightly placed between the two capacitors that are constructed above MOSFET contacts. Contact must also be made to the upper plate of each capacitor, thereby taking additional space. The requirement for contact space is in conflict with a requirement for a capacitor with a large surface area to produce a large capacitance value. As design geometries shrink, an insufficient contact-to-capacitor overlap margin, which typically results in poor window conditions, becomes a significant problem.

A stacked capacitor can be made taller to achieve larger capacitance values. In such a design, which typically involves what is known as a crown-shaped capacitor structure, insulator layers are extra thick in order to successfully cover the topology created by the capacitor structure. By using an extra thick insulator layer, the use of deep vias with high aspect ratio is required. However, such vias are difficult to produce and difficult to fill with metal. In addition, since stacked capacitors are typically constructed by processes and structures that are not directly compatible with dual damascene processes and structures, their realization requires extra process steps, extra processes, extra memory cell size, extra photomasks, and therefore, extra costs.

In conventional realizations, the structure of the contact vias is typically the same in the logic region as it is in the memory cell region. Above the contact via layer, an etch stop layer begins the dual damascene layers. Since the dual damascene structure is already used in the logic region, it is desirable to utilize this structure in the memory cell region as well.

As such, desirable in the art of memory designs are improved process that integrates fabrication of a logic device and memory cell, that improves the high aspect ratio problem in the conventional art, and that reduces the thermal budgets.

SUMMARY

The invention discloses a process for integrally fabricating a memory cell capacitor and a logic device. According to the process, a semiconductor substrate having a logic region and a memory cell region is provided. A first conductive layer in the logic region and a second conductive layer in the memory cell region are formed above the semiconductor substrate. A first photoresist layer is formed to cover the logic region, and expose the second conductive layer and a neighboring part of an inter-metal dielectric layer adjacent to the second conductive layer. The exposed neighboring part of the inter-metal dielectric layer is etched off to form an opening adjacent to the second conductive layer. A capacitor dielectric layer is formed on inner walls of the opening. A third conductive layer is formed on the capacitor dielectric layer in the opening wherein the third conductive layer, the capacitor dielectric layer and the second conductive layer constitute a capacitor.

The construction and its method of the invention, however, together with additional objects and advantages thereof will be best understood from the following description of specific embodiments when read in connection with the accompanying drawings.

BRIEF DESCRIPTION OF THE DRAWINGS

FIGS. 1A–1M illustrate a concurrent construction of a logic region and a memory cell region of an IC, in accordance with the first embodiment of the present invention.

FIG. 3 illustrates a concurrent construction of the logic region and the memory cell region of an IC, in accordance with a third embodiment of the present invention.

DESCRIPTION

In each embodiment of the present invention, storage capacitors are embedded in a dielectric layer or layers. The process steps necessary to achieve this in a memory cell region of an IC are the same as those required to embed metal-filled vias and cross-over trenches for routing metallization in the logic region of the same. The same compatible process steps of a dual damascene metallization process apply in both regions. The metal interconnection can be formed in any of the selected dielectric layers. This helps to improve the high aspect ratio issues that a conventional capacitor fabrication process usually suffers.

Figure 1A:
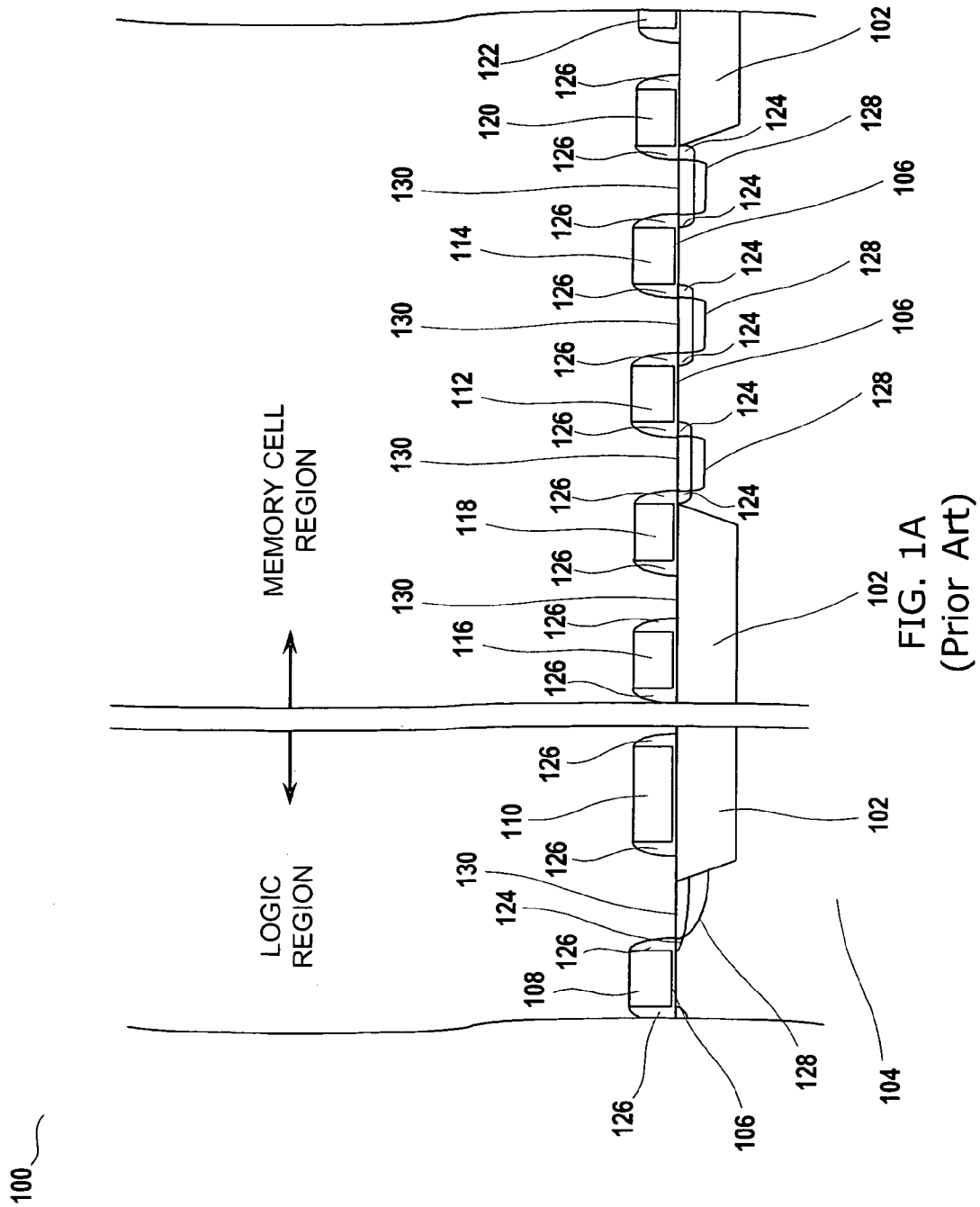

In FIG. 1A, a merged cross section 100 illustrates a setup structure to be used in later processes. This setup structure is typically known in conventional metal-oxide-semiconductor field-effect-transistor (MOSFET) chip fabrication. The logic region and the memory cell region are shown as they are fabricated on the same integrated circuit (IC) chip. At this point in the process, all structures are the same. Shallow trench isolation (STI) 102, in the semiconductor substrate 104, isolates key elements. Grown gate oxide 106 is covered by polycrystalline silicon for the poly gate 108 of a logic transistor and the poly interconnect 110 in the logic region, and for the poly gates 112 and 114 of transistors switched as memory elements on word lines in the memory cell region. Poly gate lines 116, 118, 120, and 122 are passing word lines that are transistor gates in adjacent areas of the memory array. The low-doped drain/source (LDD) 124 is implanted and diffused. Sidewall spacers 126 are formed. Plus doping 128 is implanted and diffused into the source and drain contacts 130.

Figure 1B:
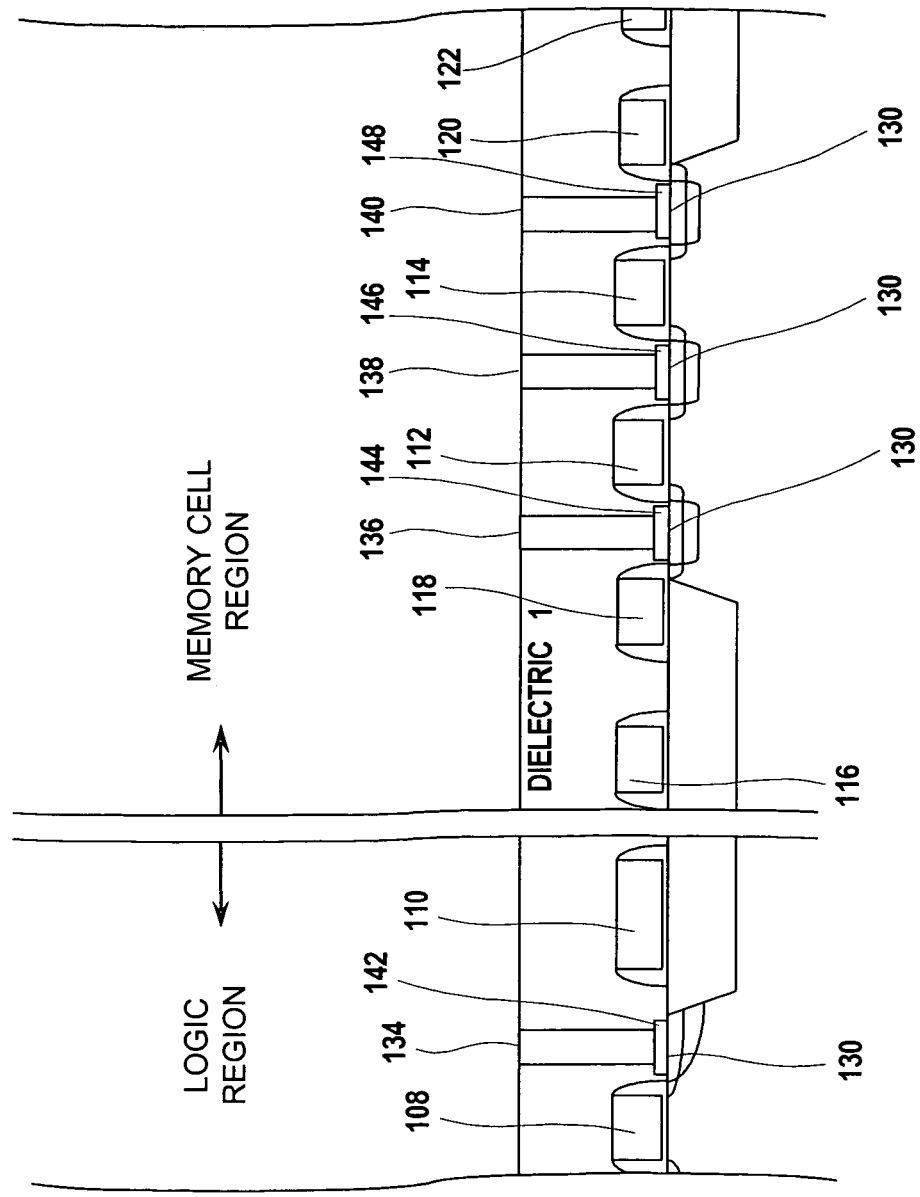

In FIG. 1B, a merged cross section 132 illustrates a stage in the concurrent construction of the logic region and the memory cell region of an IC, in accordance with the first embodiment of the present invention. From the setup structure in FIG. 1A, a silicide layer is deposited and alloyed with the poly gates 108, 112, and 114, with poly interconnect 110, with passing word lines 116, 118, 120, and 122, and with plus doped contacts 130. Metal silicide in the plus doped contacts produces self-aligned metal-silicide contacts that are called salicide. A dielectric layer, Dielectric 1, is deposited over all the active and the buried structures. Dielectric 1 is then planarized by a technique such as chemical mechanical polish (CMP). Photolithography and dry etching techniques then produce the contact vias 134, 136, 138, and 140 in Dielectric 1. Contact via 134 allows metallization to connect with the silicide contact 142 in the source or drain for the poly gate 108. Contact via 136 allows metallization to connect from a capacitor, to be constructed, to the silicide contact 144, which is the source or drain for the poly gate 112. Contact via 138 allows metallization to connect from a bit line to the silicide contact 146 that is source/drain for the poly gates 112 and 114. Contact via 140 allows metallization to connect from a capacitor, to be constructed, to the silicide contact 148. The poly gate 112 connects a capacitor, to be constructed, to the bit line according to the control of a word line. The poly gate 114 connects a capacitor, to be constructed, to the bit line according to the control of a word line.

Figure 1C:
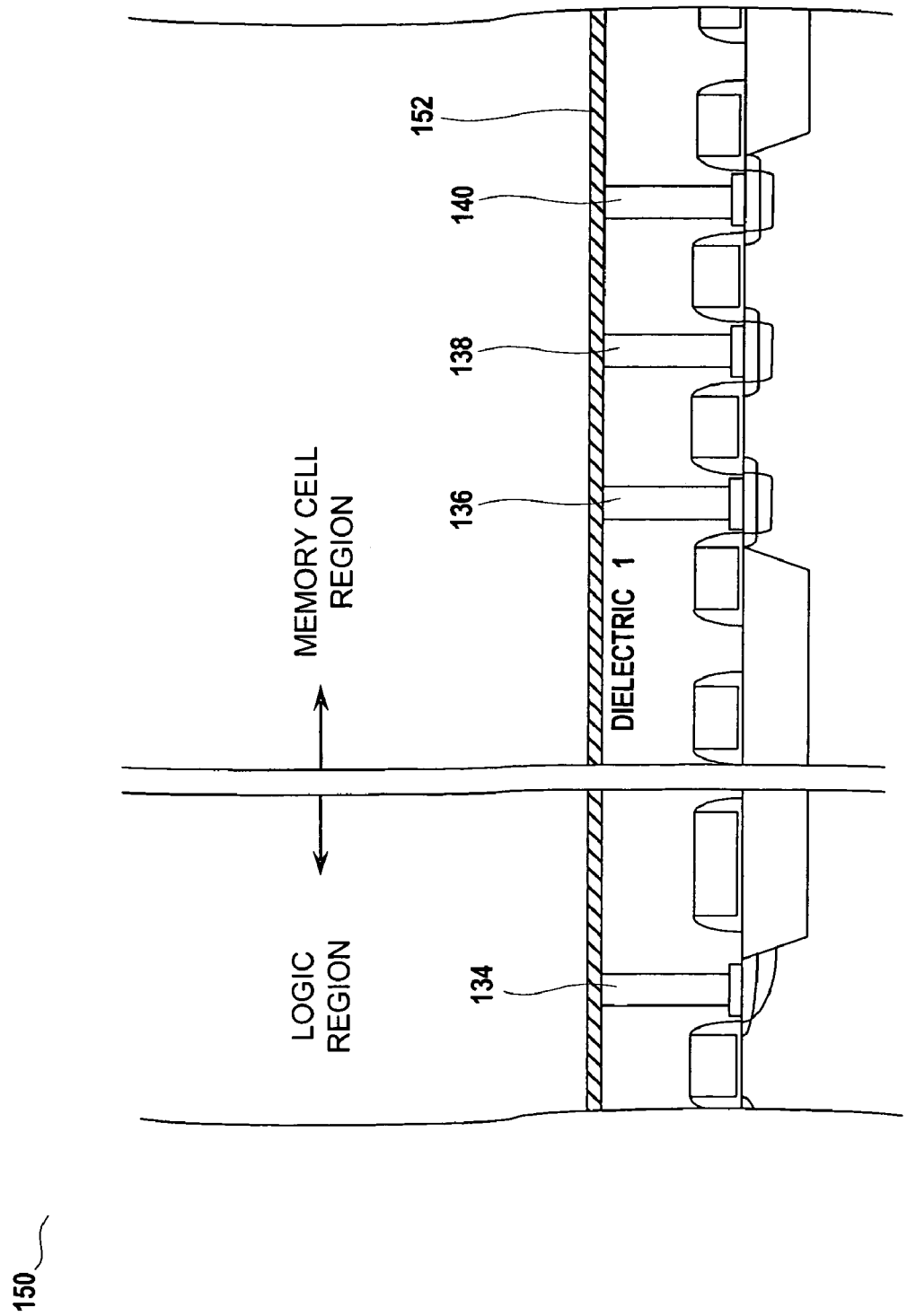

In FIG. 1C, a merged cross section 150 illustrates another stage in the concurrent construction of the logic region and the memory cell region of an IC in accordance with the first embodiment of the present invention. Contact vias 134, 136, 138, and 140 are filled with conductive materials, such as tungsten. The excess tungsten is removed and planarized, by CMP or etch back process, to the surface of Dielectric 1. An etch stop layer 152, such as a layer of silicon nitride ($Si_3N_4$), is then deposited thereon.

Figure 1D:
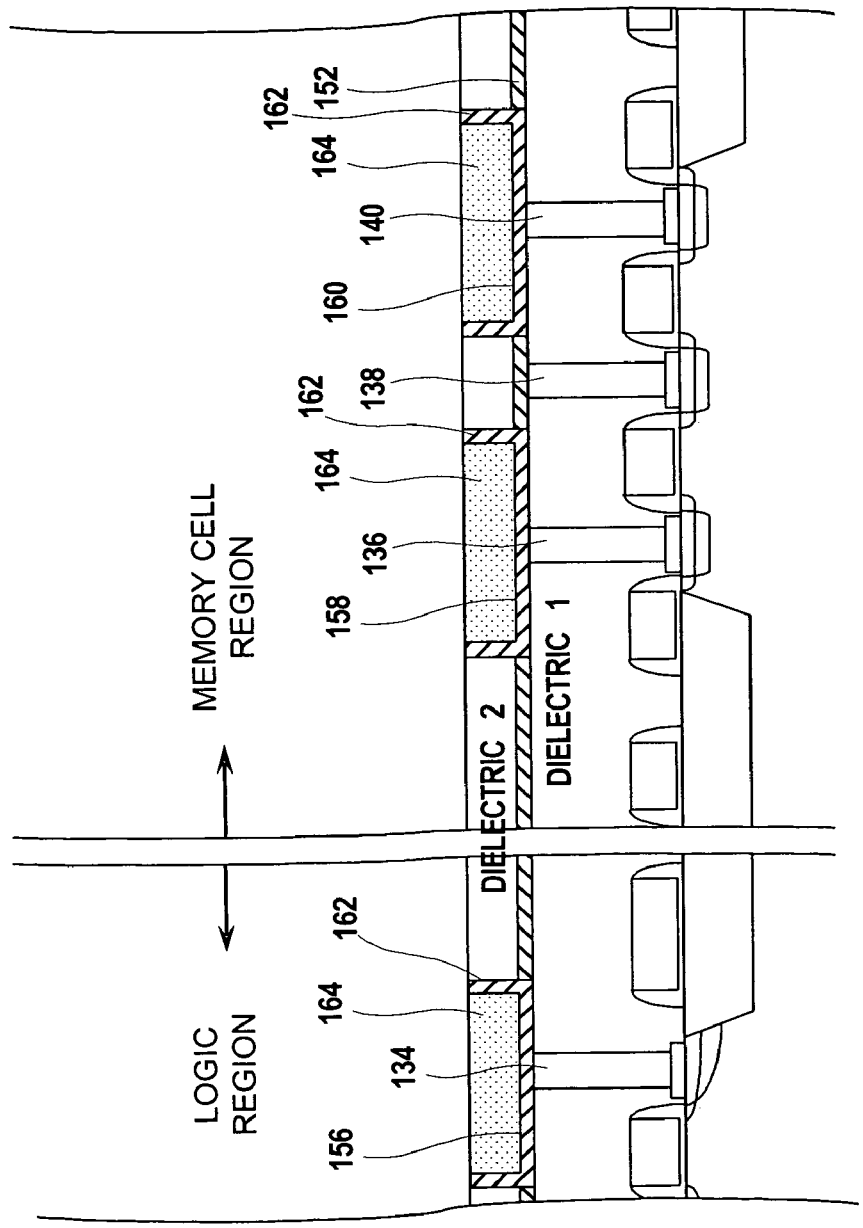

In FIG. 1D, a merged cross section 154 illustrates another stage in the concurrent construction of the logic region and the memory cell region of an IC, in accordance with the first embodiment of the present invention. After another layer of dielectric, Dielectric 2, is deposited, a single damascene metallization process is performed.

First, photolithography and dry etching techniques produce openings 156, 158, and 160 in Dielectric 2. Then, the openings are etched through the etch stop layer 152 so that the tungsten plugs in vias 134, 136, 138, and 140 are exposed. An electrically conductive barrier layer 162 is deposited to maintain separation between Dielectric 2 and the bulk conductive layer to follow. This barrier layer 162 also maintains electrical continuity between the tungsten plugs and the bulk conducive layer to follow. The barrier layer 162 may contain TaN, TiN, Ta, Ti, TaSiN, TiW, NiCr, MoN, Ru, WN, WSiN or a combination thereof. Typically, a thin seed layer of the conductive layer to follow is deposited first. Then, the bulk thickness of conductive material, such as Cu, Cu alloy, Al, Al alloy, W, metal nitride, or a combination thereof, 164 is electroplated. Then, the conductive layer 164 and the barrier layer 162 are planarized and removed down to the surface of Dielectric 2. The result is the establishment of a full-width footing for the interconnections to follow, thereby providing enough metal to prevent any damage from the future deep via etch steps. This also helps to improve the aspect ratios of the following interconnections.

Figure 1E:
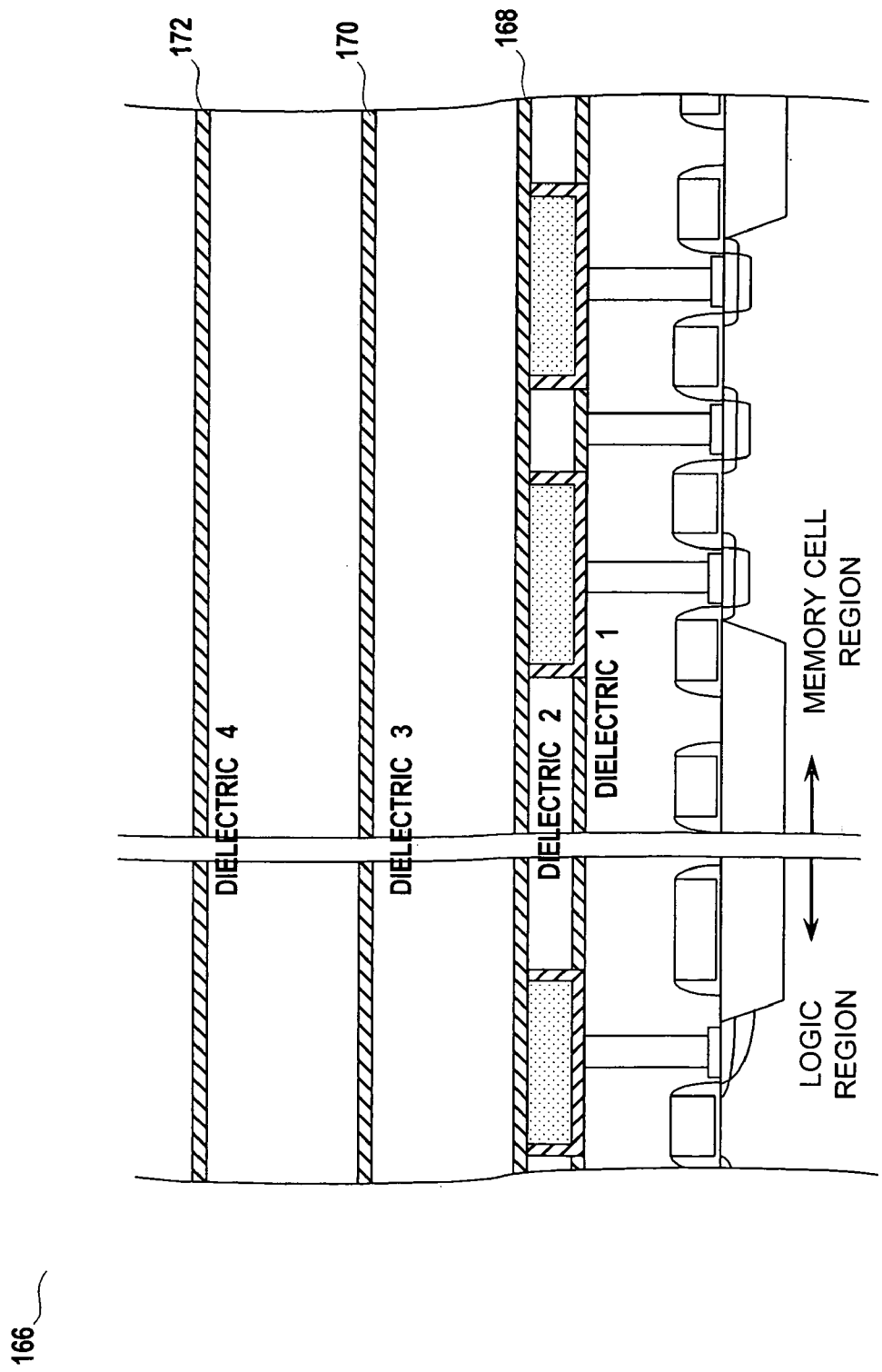

In FIG. 1E, a merged cross section 166 illustrates another stage of forming an inter-metal dielectric layer in the concurrent construction of the logic region and the memory cell region of an IC, in accordance with the first embodiment of the present invention. An etch stop layer 168, such as a layer of $Si_3N_4$, is deposited. Another dielectric layer, Dielectric 3, is then deposited. Another etch stop layer 170 is then deposited. Then, additional layer of dielectric, Dielectric 4, is deposited. Finally, yet another etch stop layer 172 is deposited. The inter-metal dielectric layer may contain silicon oxide, low-dielectric-constant materials that have a dielectric constant lower than 3.5, or a combination thereof.

In FIG. 1F, a merged cross section 174 illustrates another stage in the concurrent construction of the logic region and the memory cell region of an IC, in accordance with the first embodiment of the present invention. At this stage, a single or dual damascene metallization process is utilized. Photolithography and etching techniques produce the via openings 176, 178, and 180 through the etch stop layer 172, Dielectric 4, the etch stop layer 170, Dielectric 3, and the etch stop layer 168, down to the previously deposited conductive layer 164.

Figure 1G:
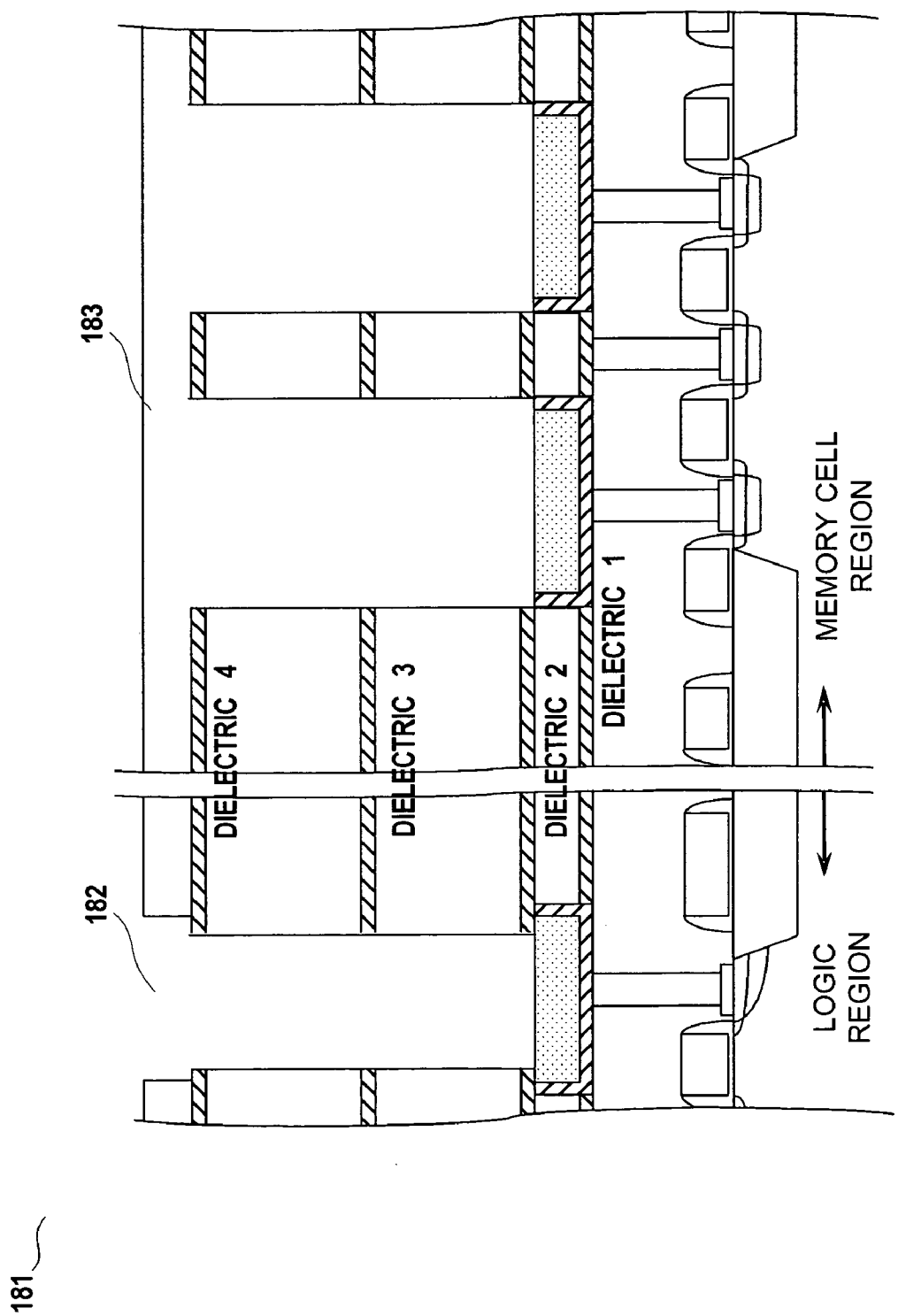

In FIG. 1G, a merged cross section 181 illustrates another stage in the concurrent construction of the logic region and the memory cell region of an IC in accordance with the first embodiment of the present invention. Photolithography techniques produce the usual trench openings, such as a trench opening 182 in the photoresist layer 183, only in the logic region. It is notable that the memory cell region is still totally covered by the photoresist layer 183. The trenches, that are etched and filled with metal, will provide interconnections between appropriate vias, later in the process.

Figure 1H:
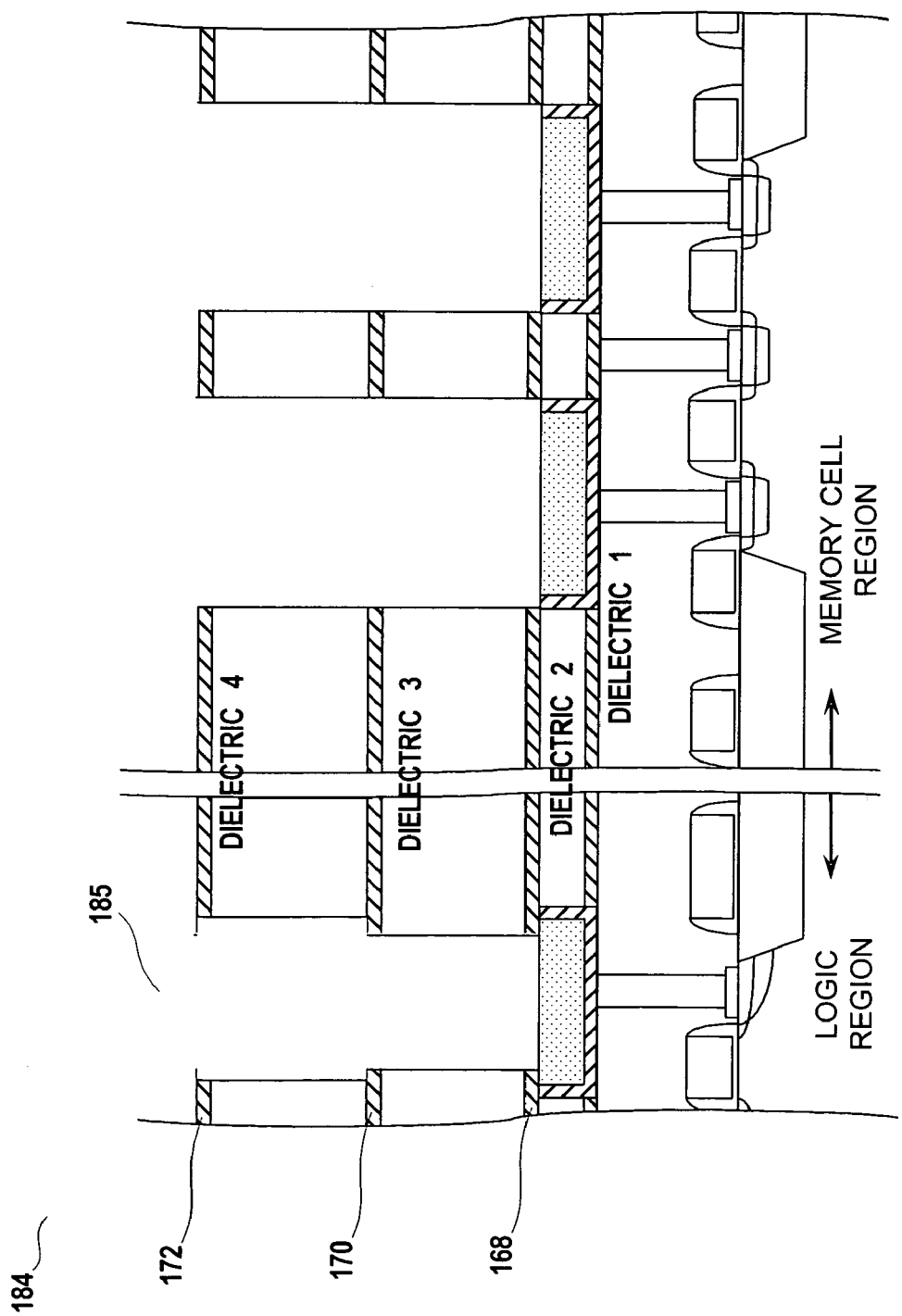

In FIG. 1H, a merged cross section 184 illustrates another stage in the concurrent construction of the logic region and the memory cell region of an IC, in accordance with the first embodiment of the present invention. Etching techniques produce the trench opening pattern 185 from the photoresist, thereby opening the areas in the etch stop layer 172 and Dielectric 4. However, the etch stop layer 170 is not affected. This will allow an interconnection between appropriate vias that are already open in the etch stop layer 170, Dielectric 3, and the etch stop layer 168, only in the logic region. Then, the photoresist layer is then removed.

Figure 1I:
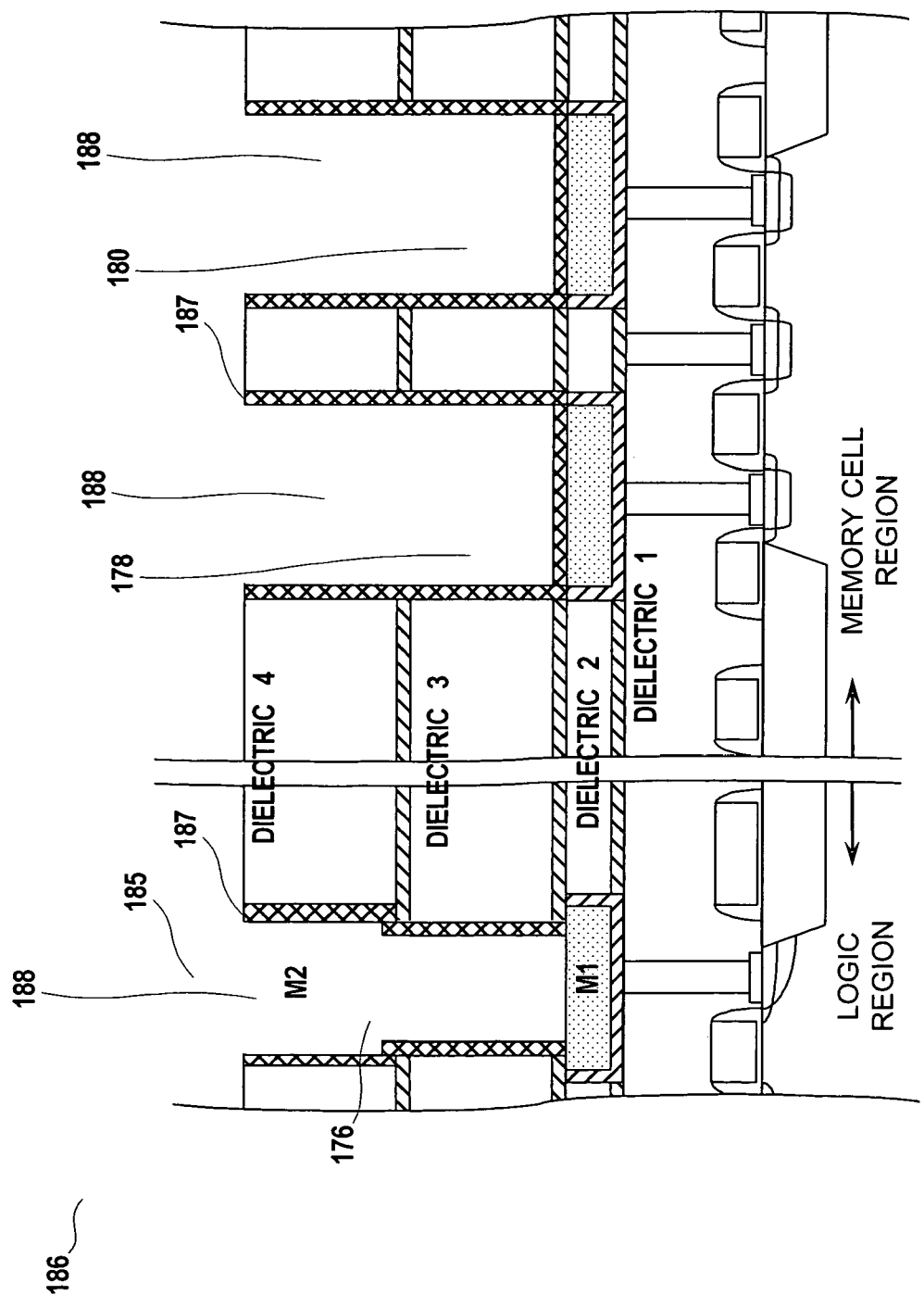

In FIG. 1I, a merged cross section 186 illustrates another stage in the concurrent construction of the logic region and the memory cell region of an IC, in accordance with the first embodiment of the present invention. A barrier layer 187 is deposited in all the trench pattern openings 185 and also in all the via openings 176, 178, and 180. The electrically conductive barrier layer 187 is deposited to maintain separation between Dielectric 3 and Dielectric 4, and the bulk conductive layer to follow. This barrier layer 187 also maintains electrical continuity between the conductive layer of metal layer M1 that is embedded within Dielectric 2 and the bulk conductive layer to follow. The barrier layer 162 may contain TaN, TiN, Ta, Ti, TaSiN, TiW, NiCr, MoN, Ru, WN, WSiN. Typically, a thin seed layer of the conductive layer to follow, such as Cu, Cu alloy, Al, Al alloy, W, metal nitride, or a combination thereof, is first deposited onto barrier layer 187. Then, the bulk thickness of the conductive layer 188 is electroplated as metal layer M2. Then, the conductive layer 188, the barrier layer 187, and the etch stop layer 172 (see FIG. 1H), are planarized and removed, down to the surface of Dielectric 4, by a CMP process.

Up to this stage in the process, all process steps and structures, except the trench pattern opening 185, have the same thickness and appear in the same order in both the logic region and in the memory cell region of an IC. The conductive layers 188 in the memory cell region are in substantial alignment with their underlying conductive layer 136. (see FIG. 1D).

In the following process steps, differences in processing methods will appear, between the logic region and the memory cell region. However, since neither region is impacted by the differences, concurrent construction can continue afterward.

Figure 1J:
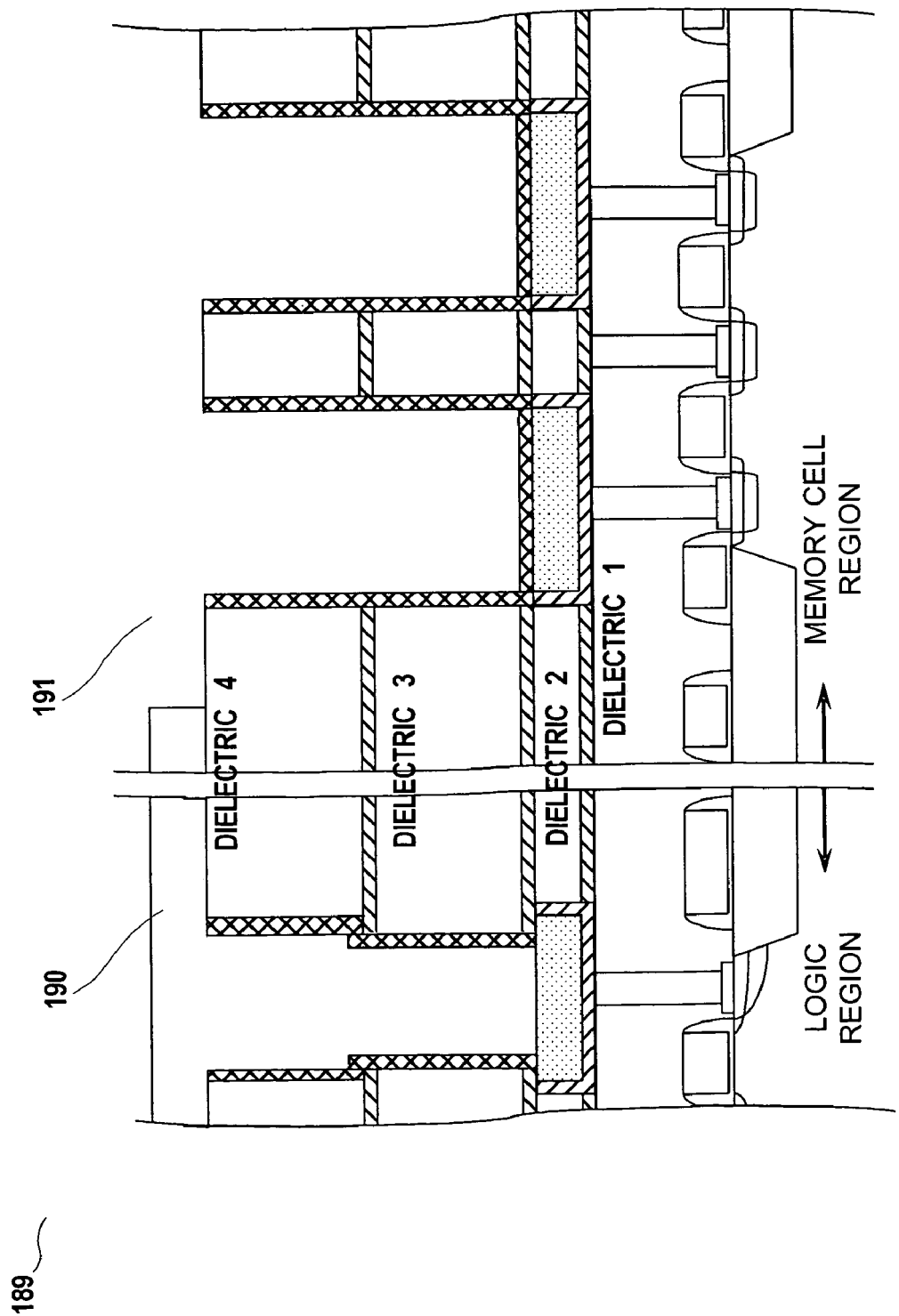

In FIG. 1J, a merged cross section 189 illustrates another stage in the concurrent construction of the logic region and the memory cell region of an IC, in accordance with the first embodiment of the present invention. Photolithography techniques produce a photoresist layer 190 with a patterned opening 191, only in the memory cell region. The patterned opening 191 exposes an neighboring part of Dielectric 4 adjacent to the conductive layer 188 that will be removed to allow the production of the top plate of MIM capacitors.

Figure 1K:
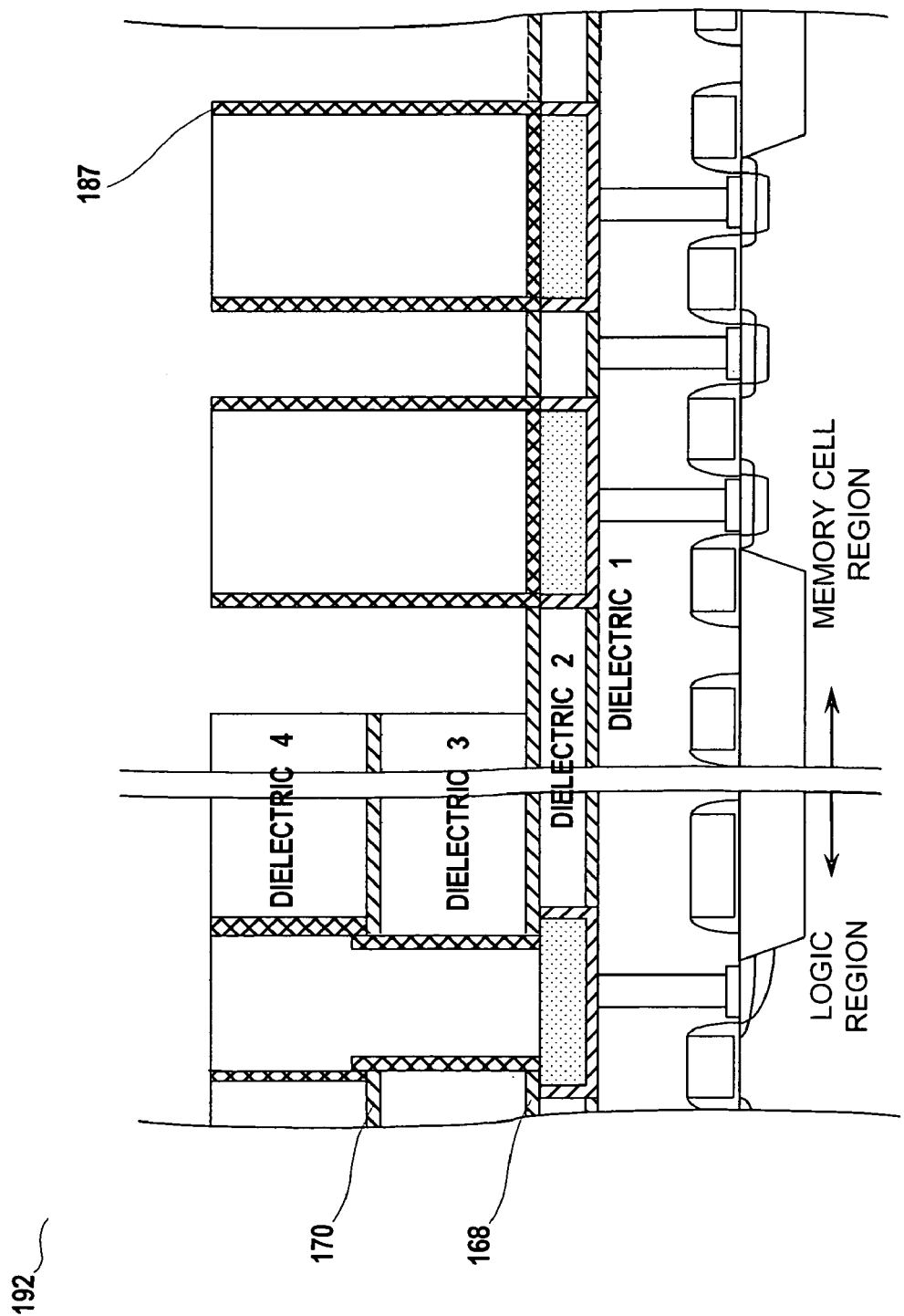

In FIGS. 1J and 1K, a merged cross section 192 illustrates another stage in the concurrent construction of the logic region and the memory cell region of an IC, in accordance with the first embodiment of the present invention. Eching techniques produce the removal, beneath the photoresist opening 191, shown in FIG. 1J, of the Dielectric 4, the etch stop layer 170, and the Dielectric 3, but not the etch stop layer 168. The barrier metal layer 187 that surrounds the conductive layer 188 is chosen to be resistant to this etch, and it remains after the etch. The etch process exposes the vertical side surface of the barrier metal layer that covers the conductive material that fills the previous vias 178 and 180, shown in FIG. 1I. This provides the larger surface area for the insulator layer of a capacitor.

Figure 1L:
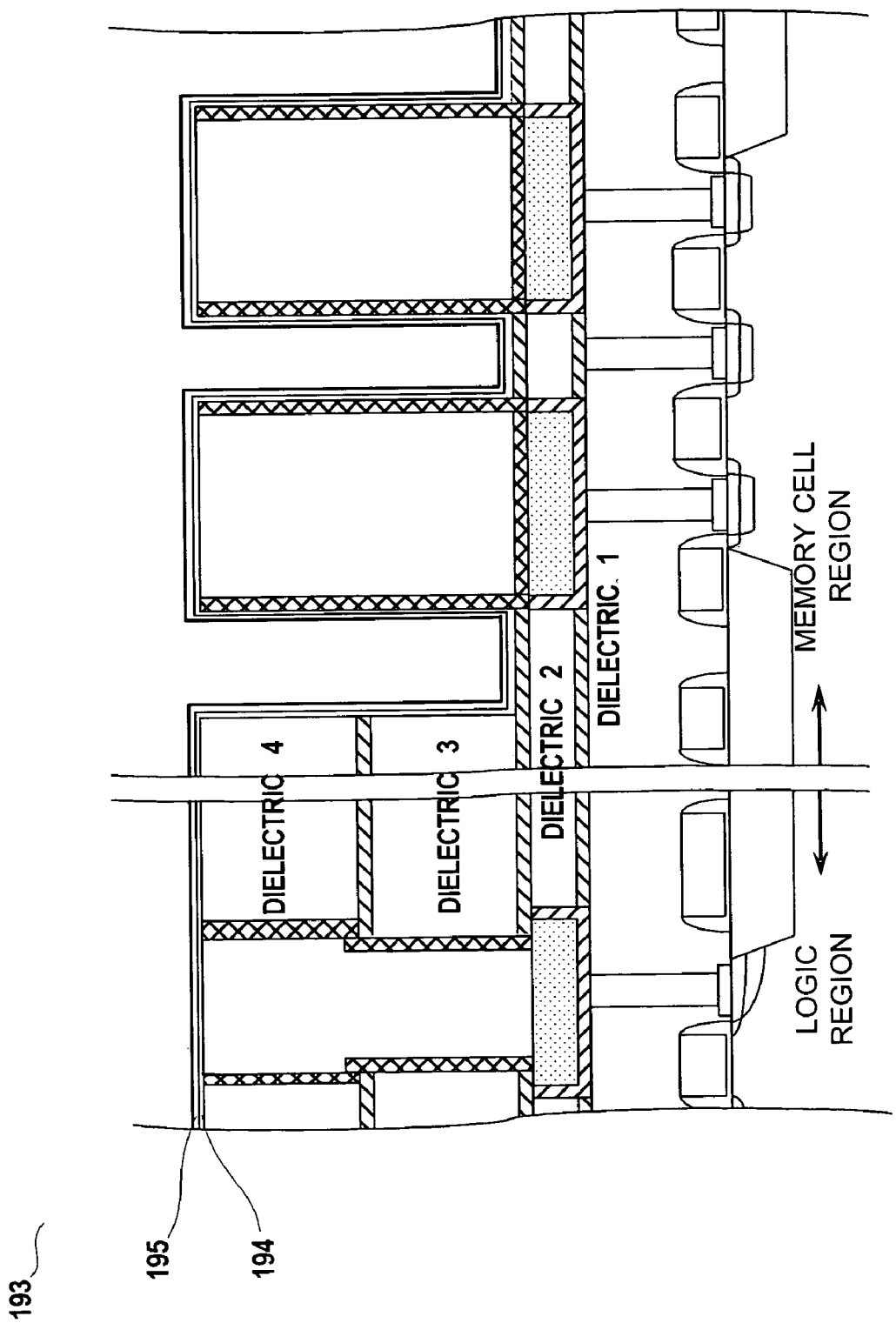

In FIG. 1L, a merged cross section 193 illustrates another stage in the concurrent construction of the logic region and the memory cell region of an IC, in accordance with the first embodiment of the present invention. An capacitor dielectric layer 194 is deposited over the entire IC. This dielectric layer 194 is in contact with the top of the conductive layer and also the surrounding barrier metal layer, and it forms the intermediate insulator of a capacitor. Examples of suitable dielectric layer materials include $Ta_2O_5$, PZT, BST, $HfO_2$, $Al_2O_3$, AlTiOx or a combination thereof. An electrically conductive layer 195 is deposited as a top electrode of a capacitor. Examples of suitable conducting layer materials include TaN, TiN, Ta, Ti, TaSiN, TiW, NiCr, MoN, Ru, WN, WSiN, and a combination thereof.

Figure 1M:
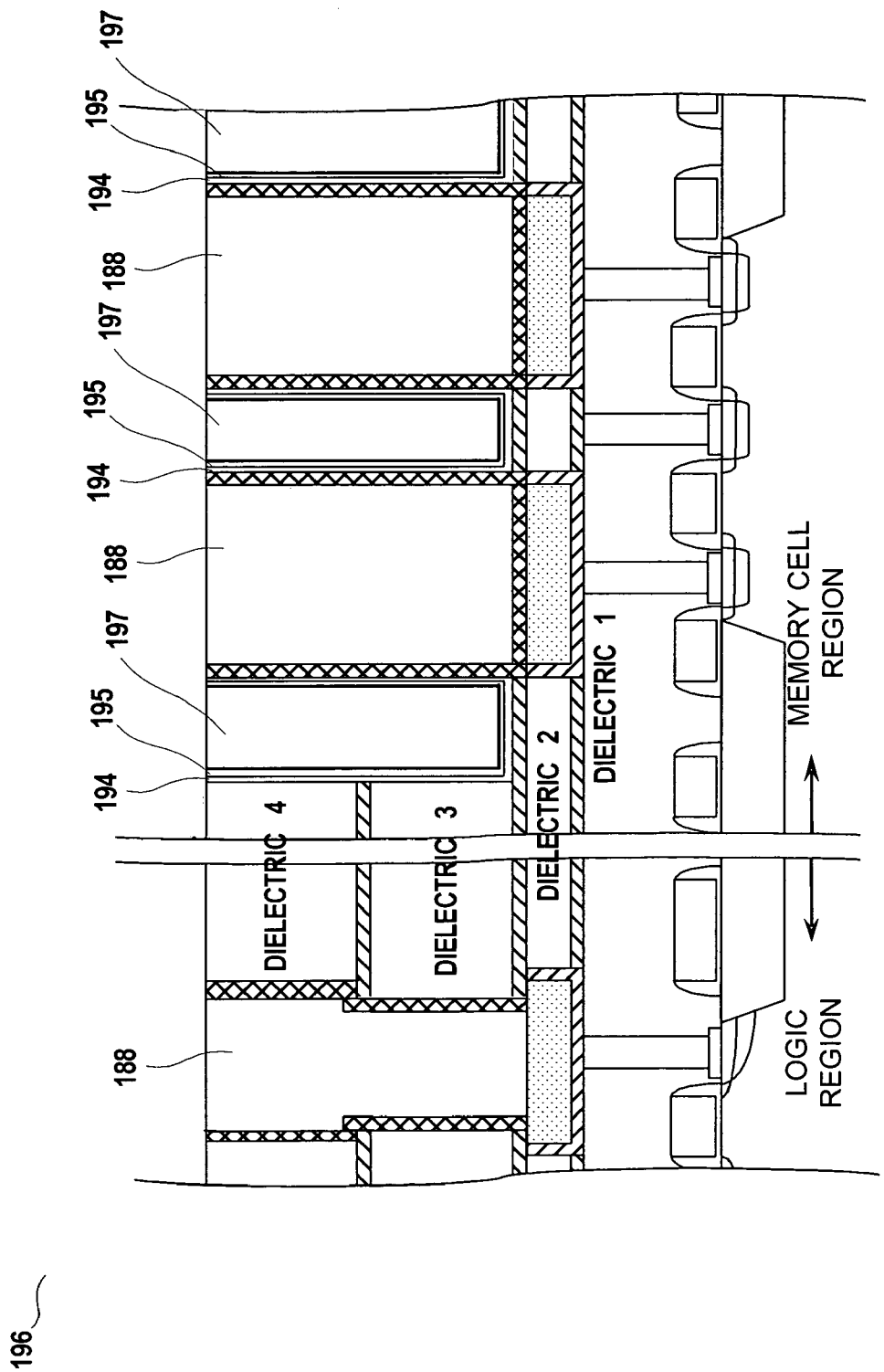

In FIG. 1M, a merged cross section 196 illustrates a stage in the concurrent construction of the logic region and the memory cell region of an IC, in accordance with the first embodiment of the present invention. A conductive layer 197 is deposited on the conductive layer 195 on the surface of the volume created by the etch. This forms the top electrode of a capacitor.

The deposited conductive layer 197, the deposited conductive layer 195, and the capacitor dielectric layer 194 are planarized and removed by a CMP process down to the top surface of Dielectric 4, the top surface of the newly deposited conductive layer 197, and the top surface of the conductive layer 188. Both the top surface of conductive layer 188, which forms the metal layer M2 in the logic region and the bottom electrode of a capacitor in the memory cell region, and the top surface of conductive layer 197, which forms the top electrode of a capacitor, are accessible for connection to further metal interconnection. The top electrode extends beyond a vertical boundary of the conductive layer 164 (see FIG. 1D). This improves the high aspect ratio problem during formation of the conductive layers 188.

Figure 2A:
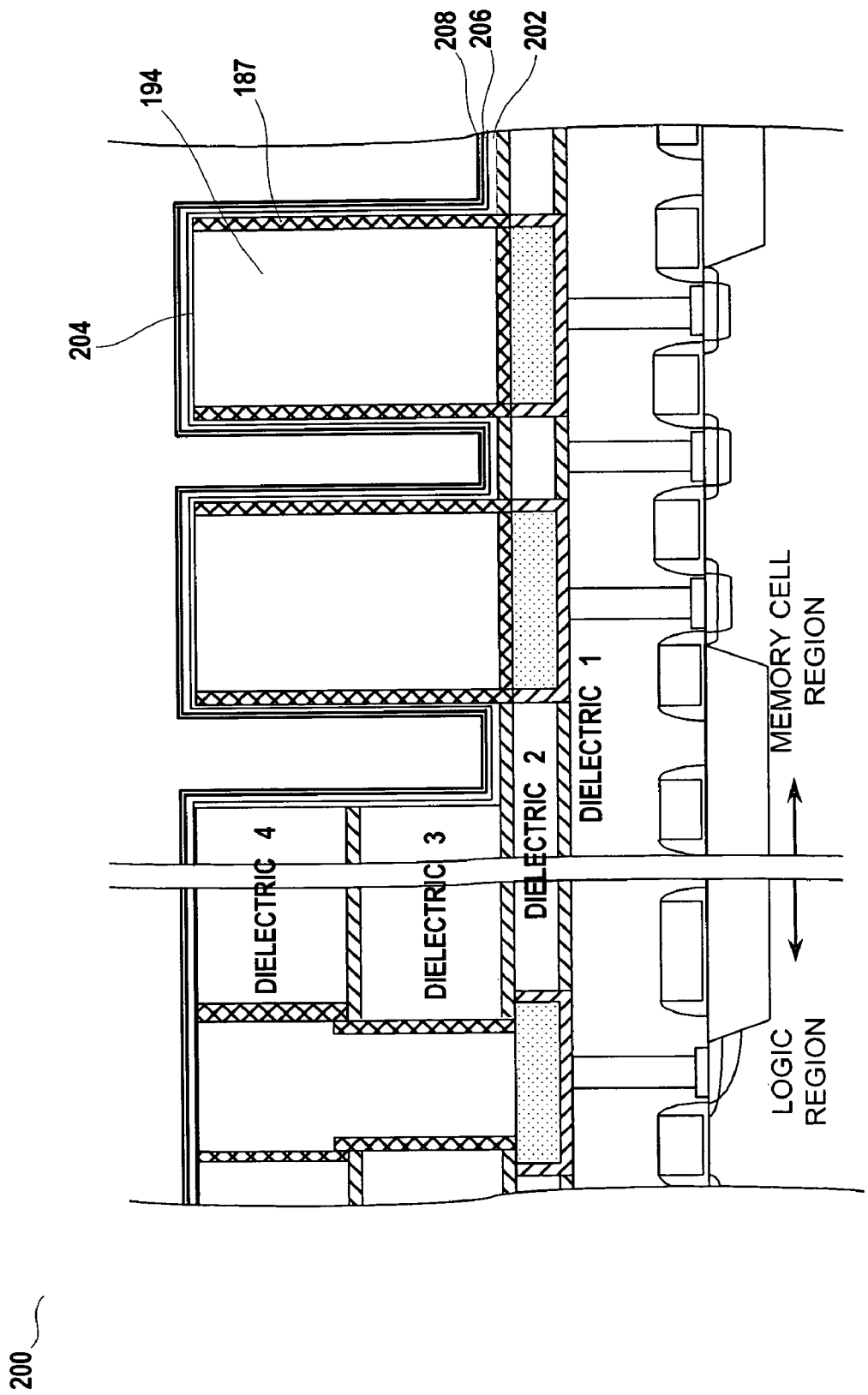
FIGS. 2A–2B illustrate a concurrent construction of the logic region and the memory cell region of an IC, in accordance with a second embodiment of the present invention.

In a second embodiment of the present invention, one extra feature is added. In FIG. 2A, a merged cross section 200 illustrates a stage in the concurrent construction of the logic region and the memory cell region of an IC in accordance with the second embodiment of the present invention. This stage is the same as that shown in FIG. 1L, wherein a dielectric layer 206 is deposited as the intermediate insulator of a capacitor, and an electrically conductive layer 208 is deposited as a top electrode of a capacitor. However, in this stage in FIG. 2A, prior to the deposition of the dielectric layer 206 and the electrically conductive layer 208, a second electrically conductive barrier layer 202 is deposited. The second electrically conductive barrier layer 202 covers the first electrically conductive barrier layer 187 that is on the vertical sidewall of the conductive layer 194, and it also covers the exposed top surface 204 of the conductive layer 194. Therefore, in this embodiment, all surfaces of the conductive layer 194 are covered by at least one electrically conductive barrier layer 202. Therefore, direct contact between conductive layer 194 and a dielectric layer 206 is prevented.

Figure 2B:
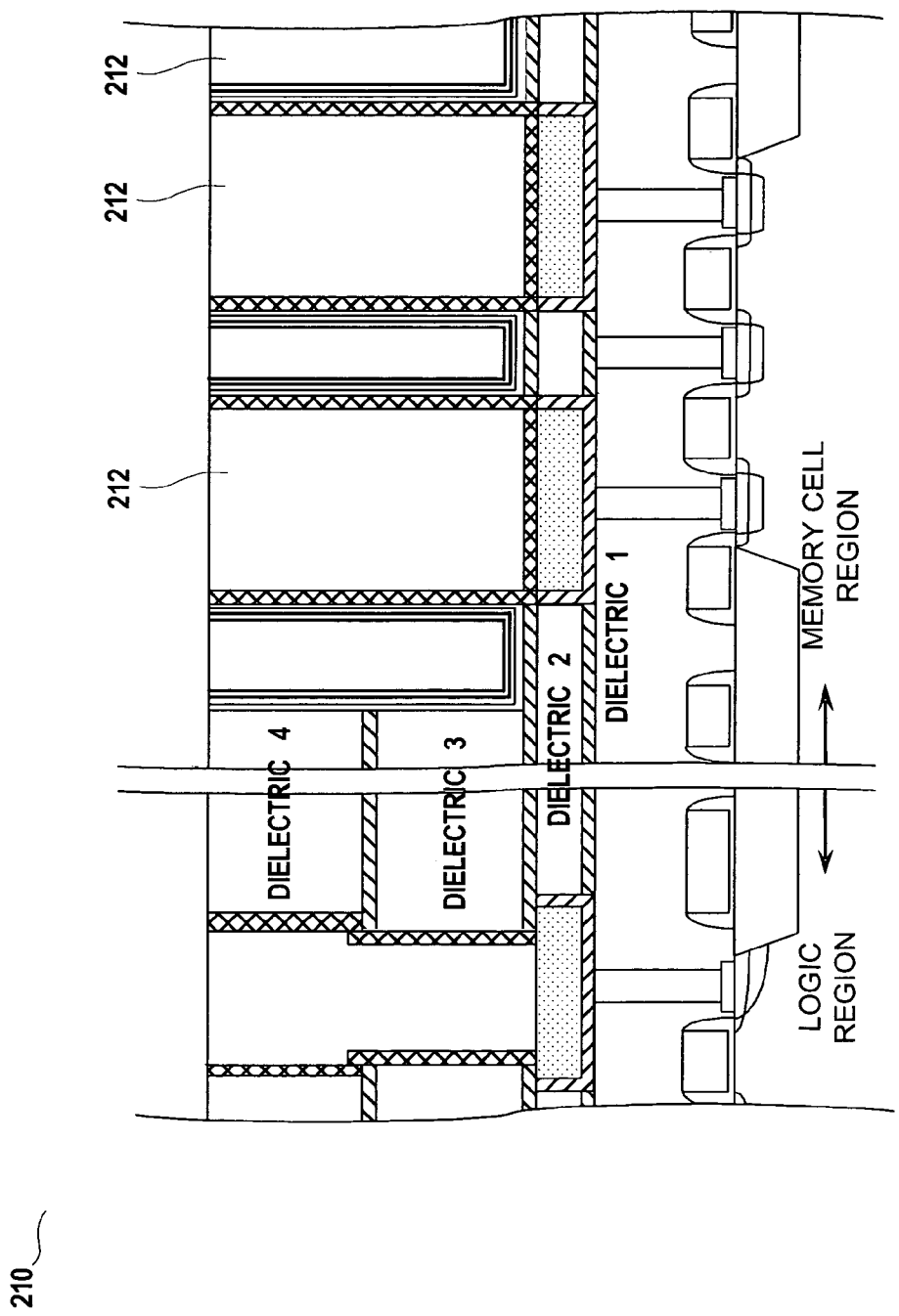

In FIG. 2B, a merged cross section 210 illustrates a stage in the concurrent construction of the logic region and the memory cell region of an IC in accordance with the second embodiment of the present invention. Conductive material, such as copper, 212 is deposited, thereby covering all the exposed surfaces. Conductive layer 212 fills the volume created in the Dielectric 3 and 4, and becomes the top electrode of a capacitor.

In FIG. 3, a merged cross section 300 illustrates a stage in the concurrent construction of the logic region and the memory cell region of an IC, in accordance with the third embodiment of the present invention. Dielectric 5, the etch stop layer 302, and Dielectric 6 are deposited on the previous etch stop layer 172. A conductive material, as metal layer M3, is deposited in vias and trench 304 in the logic region, and as capacitor bottom electrodes 306 and 308 in the memory cell region. The bottom electrodes are connected downward, through the previously constructed conductive layer to contacts to transistors. Similar to the first and the second embodiments, the top electrode 310 of the capacitors is formed of conductive material, such as copper. In this third embodiment, capacitors are constructed in the same manner as in the first and second embodiments, except that the capacitors are embedded within Dielectric 5 and 6, and connected to conductive layers in M1 through interconnection structures in M2. The interconnection formed in M2 can be a either single damascene structure or dual damascene structure.

Figure 4:
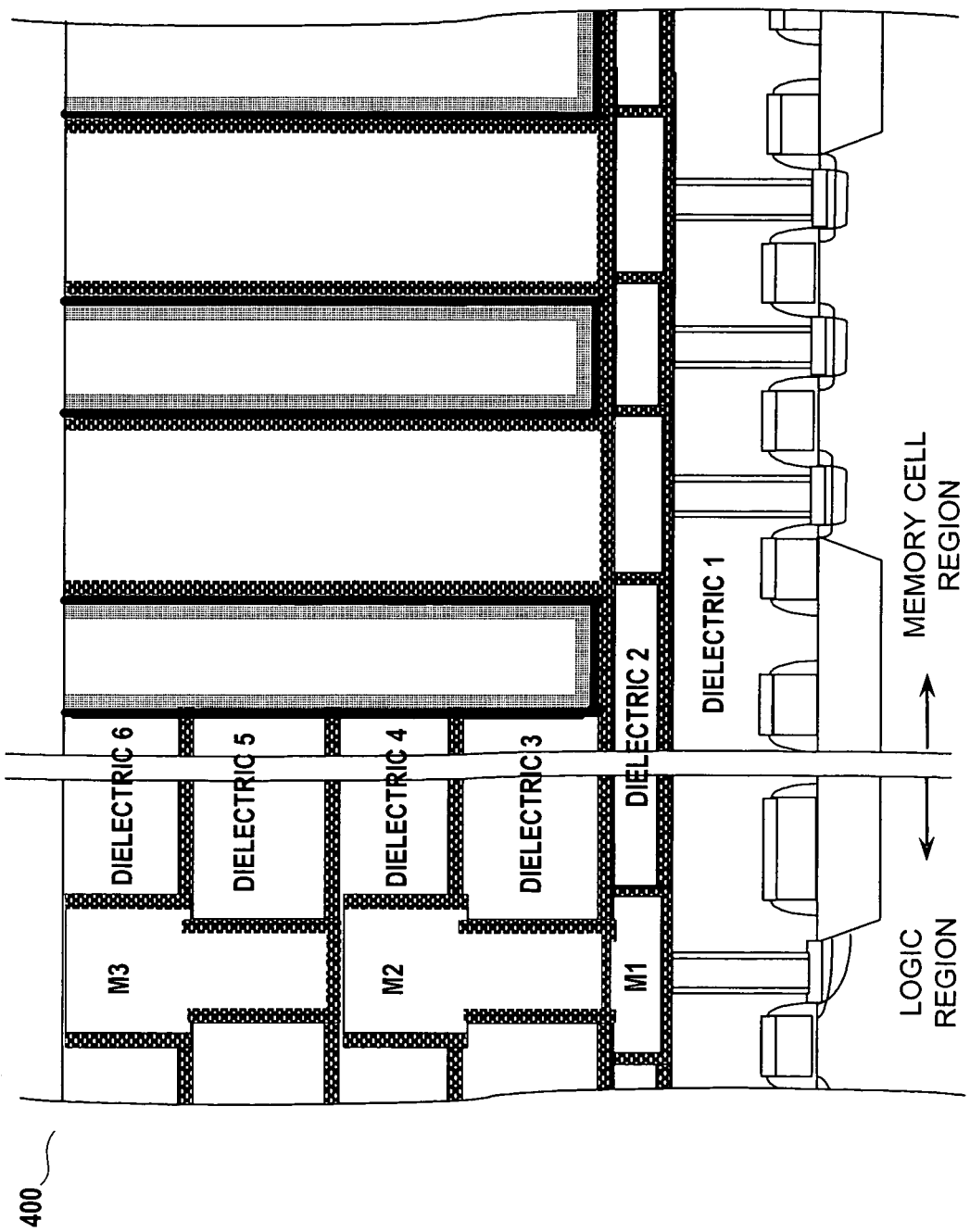
FIG. 4 illustrates a concurrent construction of the logic region and the memory cell region of an IC, in accordance with a fourth embodiment of the present invention.

In FIG. 4, a merged cross section 400 illustrates a stage in the concurrent construction of the logic region and the memory cell region of an IC in accordance with the fourth embodiment of the present invention. In this fourth embodiment, taller capacitors with larger surface areas are embedded within the Dielectric 3, 4, 5, and 6. The added height provides extra vertical surface area. This embodiment is essentially a combination of others.

Figure 5A:
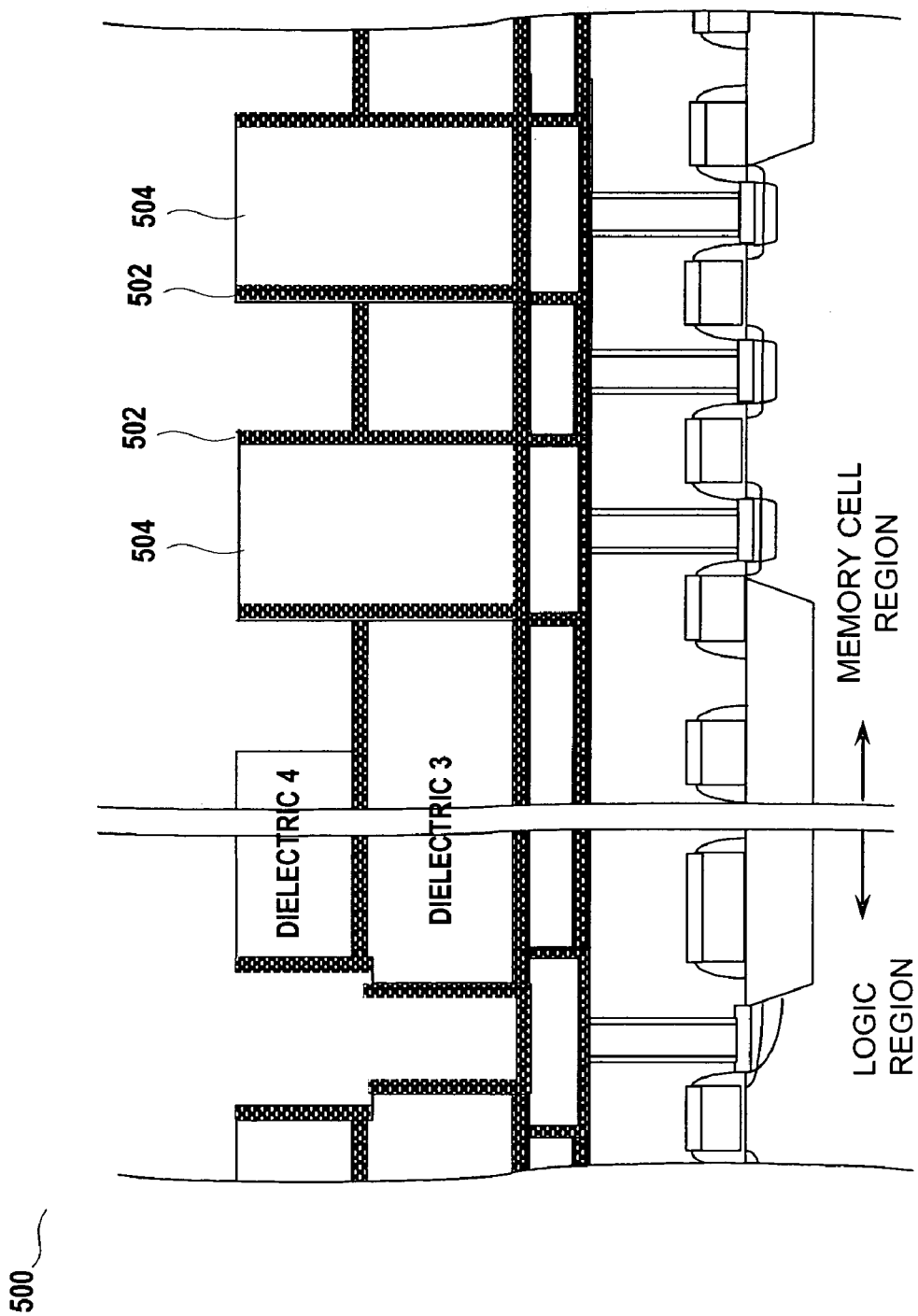
FIGS. 5A–5C illustrate a concurrent construction of the logic region and the memory cell region of an IC, in accordance with a fifth embodiment of the present invention.

In FIG. 5A, a merged cross section 500 illustrates a stage in the concurrent construction of the logic region and the memory cell region of an IC in accordance with the fifth embodiment of the present invention. In this fifth embodiment, the etch step removes dielectric and thereby exposes the vertical side surface area 502 of conductive layer 504 that fills vias. The etch step only etches the current trench-level oxide down to, but not into, the etch stop layer, and does not etch into the current via-level oxide. In the case shown, the Dielectric 4 is etched, but the Dielectric 3 is not. This limits the surface area that becomes available as an intermediate dielectric for a capacitor.

Figure 5B:
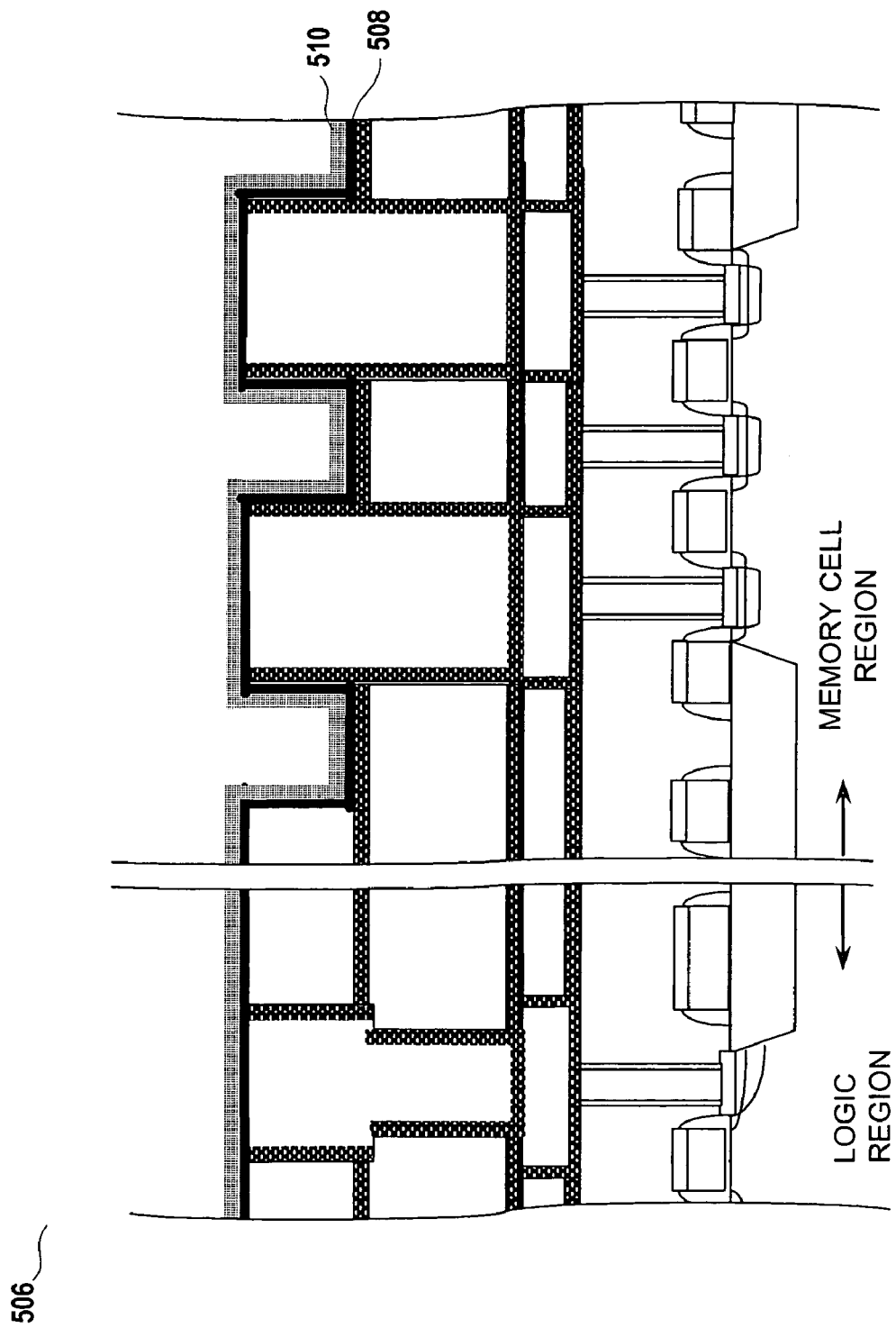

In FIG. 5B, a merged cross section 506 illustrates a stage in the concurrent construction of the logic region and the memory cell region of an IC in accordance with the fifth embodiment of the present invention. A capacitor dielectric layer 508 is deposited over the entire IC and this serves as an intermediate insulator of a capacitor. An electrically conductive layer 510 is deposited over the dielectric layer 508 and this serves as the top electrode of a capacitor. The etch process is an easier process since it is a relatively shallower one. It is understood that a smaller capacitance is adequate in some applications.

Figure 5C:
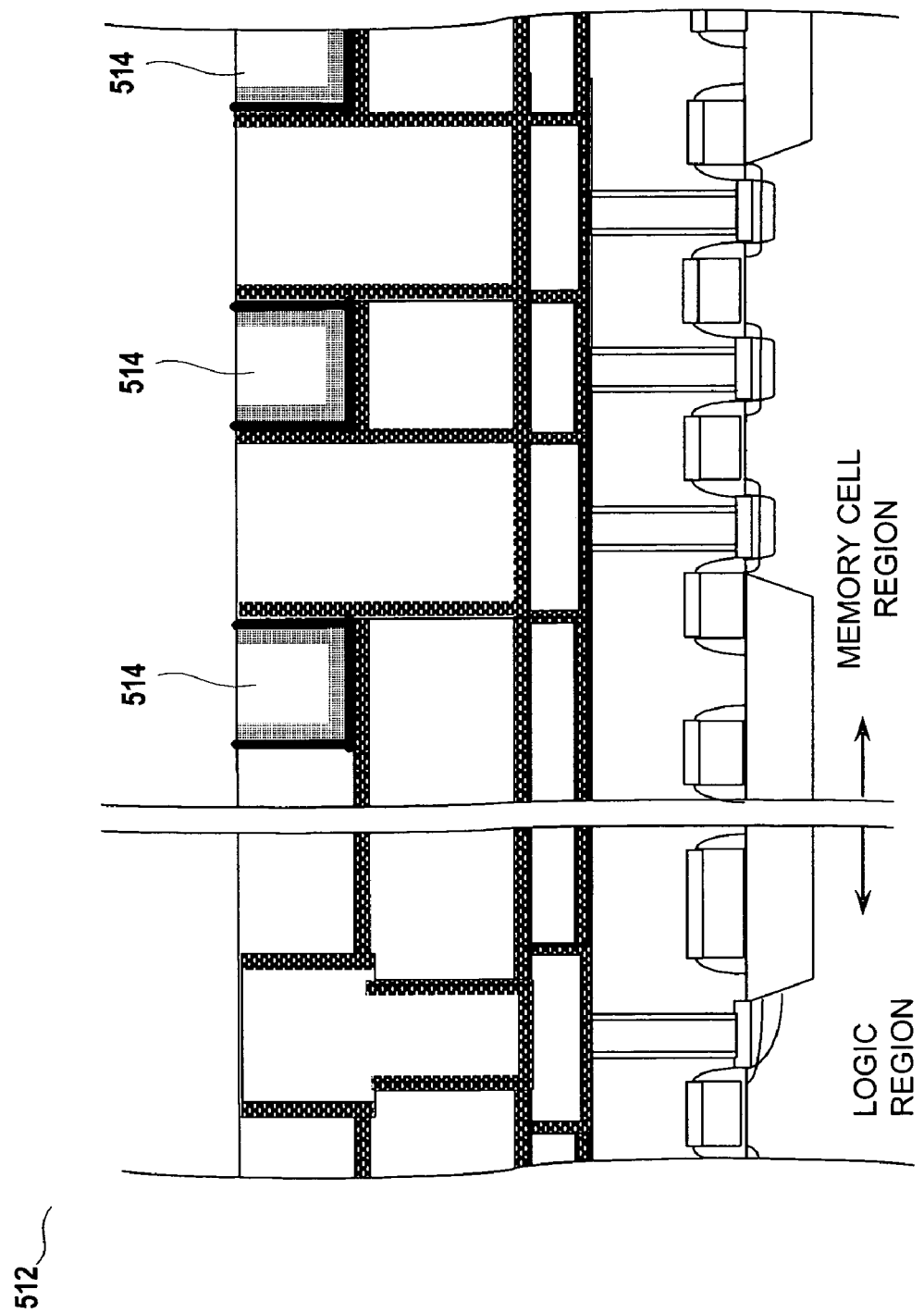

In FIG. 5C, a merged cross section 512 illustrates a stage in the concurrent construction of the logic region and the memory cell region of an IC in accordance with the fifth embodiment of the present invention. A conductive layer 514 is deposited in the volume produced by the etch process. The deposited materials are planarized and removed by a CMP process. The structure is ready for further metallization layers.

Figure 6:
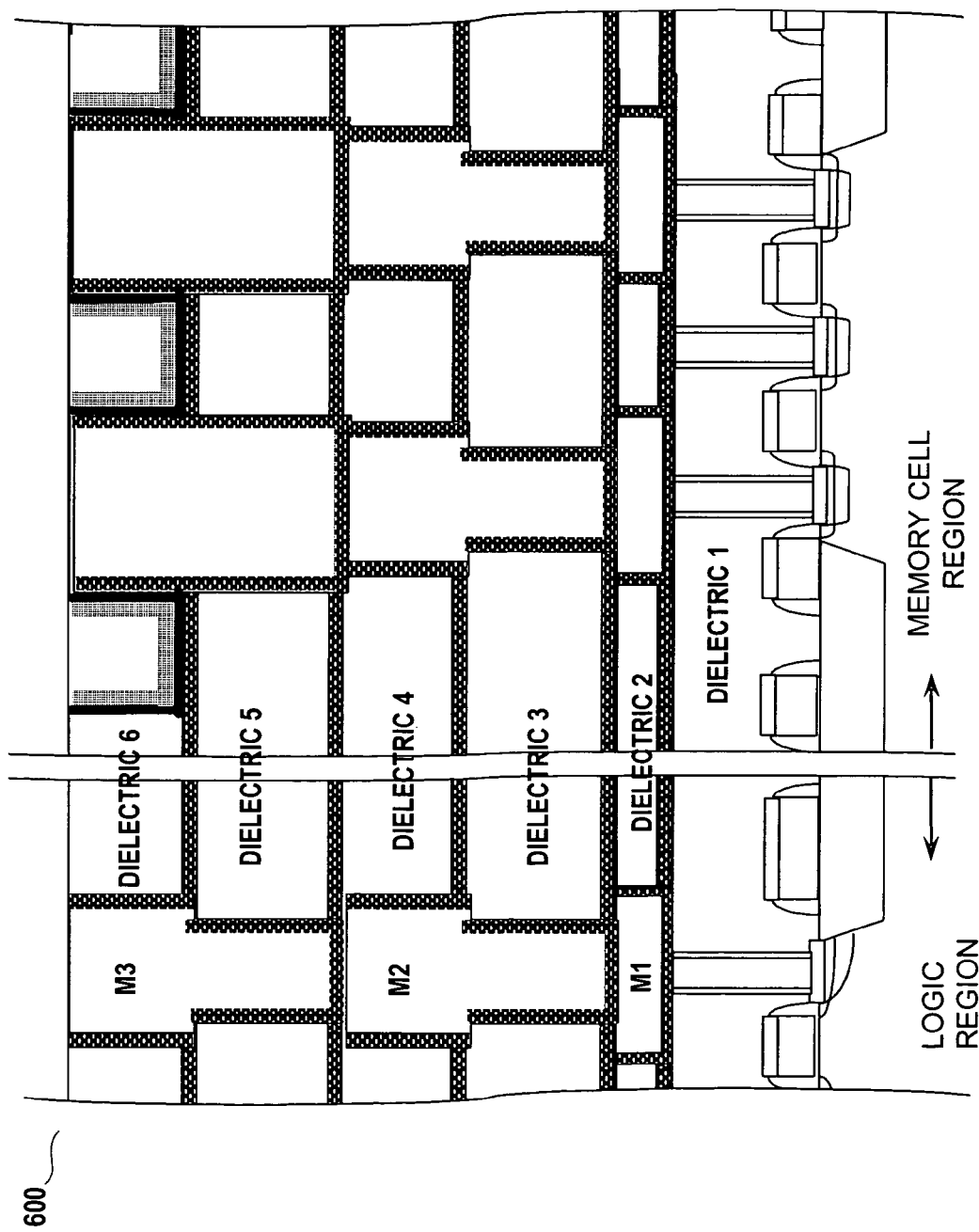
FIG. 6 illustrates a concurrent construction of the logic region and the memory cell region of an IC, in accordance with a sixth embodiment of the present invention.

In FIG. 6, a merged cross section 600 illustrates a stage in the concurrent construction of the logic region and the memory cell region of an IC in accordance with the sixth embodiment of the present invention. This embodiment produces the same capacitor structure as that in FIG. 5C, but it is embedded in upper oxide layers, such as Dielectric 5 and 6, and connected to conductive layers in M1 through interconnection structures in M2.

All embodiments of the current invention simultaneously produce logic region structures and memory cell region structures by means of compatible processes.

In this invention, a dual damascene structure, which is commonly used in the logic region, is also used in the memory cell region. As vias and trenches are etched and filled with metal in the logic region, various via and trench structures are simultaneously etched and filled with metal in the memory cell region. However, in the memory cell region, a vertical metal structure that is constructed has a different use. The vertical side surface becomes the surface area of the insulator layer of a capacitor. First, the oxide that surrounds the new metal via and/or trench is exposed to a vertical dry etch by a special photomask. As the oxide layers are removed by the action of the etch, the metal side surface area becomes available to be covered by selected thin barrier and/or oxide layers that will become the insulator layer of a capacitor. A new metal layer, typically copper, is deposited to fill the etched cavity. The new insulator and metal layers are planarized and removed by chemical mechanical polish processes. The vertical side surface insulator area, which is between the original bottom electrode metal and the last top electrode metal, is the area that determines the size and value of the capacitor. The capacitor structure may be placed within any metal layer of multilevel dual damascene metallization.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for integrally fabricating a memory cell capacitor and a logic device, the method comprising:
    providing a semiconductor substrate having a logic region and a memory cell region;
    forming a first conductive layer in the logic region and a second conductive layer in the memory cell region, above the semiconductor substrate;
    forming a first photoresist layer covering the logic region, and exposing the second conductive layer and a neighboring part of an inter-metal dielectric layer adjacent to the second conductive layer;
    etching off the exposed neighboring part of the inter-metal dielectric layer to form an opening adjacent to the second conductive layer;
    forming a capacitor dielectric layer on inner walls of the opening; and
    forming a third conductive layer on the capacitor dielectric layer in the opening wherein the third conductive layer, the capacitor dielectric layer and the second conductive layer constitute a capacitor.

2. The method of claim 1 wherein the third conductive layer laterally extends beyond a vertical boundary of the second conductive layer.

3. The method of claim 1, before the step of forming a first photoresist layer, further comprising:
    depositing a first etch stop layer over the first and second conductive layers;
    depositing a first dielectric layer on the first etch stop layer;
    depositing a second etch stop layer on the first dielectric layer; and
    depositing a second dielectric layer on the second etch stop layer.

4. The method of claim 3, before the step of forming a first photoresist layer, further comprising: etching through the second dielectric layer, the second etch stop layer, the first dielectric layer and the first etch stop layer, to form a first via exposing the first conductive layer, and a second via exposing the second conductive layer, wherein the second via is in substantial alignment with the second conductive layer.

5. The method of claim 4, before the step of forming a first photoresist layer, further comprising:
    forming a second photoresist layer to cover the memory cell region, and partially expose the logic region to define an etch window around the first via;

etching off an exposed part of the second dielectric layer through the etch window until the second etch stop layer, thereby forming a trench above the first via; and removing the second photoresist layer.

6. The method of claim 5, before the step of forming a first photoresist layer, further comprising:

depositing a conductive material into the trench and the first via to from a fourth conductive layer; and depositing a conductive material into the second via to form a fifth conductive layer.

7. The method of claim 5 wherein the etching off the exposed neighboring part comprises etching through the second dielectric layer until the second etch stop layer exposed.

8. The method of claim 5 wherein the etching off the exposed neighboring part comprises etching through the second dielectric layer, the second etch stop layer and the first dielectric layer until the first etch stop layer exposed.

9. The method of claim 8 further comprising forming a first interconnection structure interposed between the first conductive layer and the fourth conductive layer for coupling the same.

10. The method of claim 8 further comprising forming a second interconnection structure interposed between the second conductive layer and the fifth conductive layer for coupling the same.

11. A semiconductor capacitor structure comprising:

a substrate having an active area;

a first capacitor electrode having a first conductive layer above the active area and connected to the same, and a second conductive layer formed above the first conductive layer, wherein the second conductive layer is electrically coupled to the first conductive layer;

a capacitor dielectric layer formed on a side wall of the second conductive layer; and a second capacitor electrode formed on the capacitor dielectric layer and extending beyond the vertical boundary of the first conductive layer, wherein the second capacitor electrode of the semiconductor capacitor structure is shared by a neighboring semiconductor capacitor structure thereof without any intermetal dielectric layer interposed therebetween.

12. The semiconductor capacitor structure of claim 11 wherein the first capacitor electrode comprises an interconnection structure connecting the first conductive layer to the second conductive layer.

13. The semiconductor capacitor structure of claim 11 wherein the first capacitor electrode comprises a first barrier layer formed between the second conductive layer and the capacitor dielectric layer as well as the first conductive layer.

14. The semiconductor capacitor structure of claim 11 wherein the capacitor dielectric layer forms an elongated trench at a side of the second conductive layer.

15. The semiconductor capacitor structure of claim 14 wherein the second capacitor electrode comprises a second barrier layer formed along the capacitor dielectric layer inside the trench.

16. The semiconductor capacitor structure of claim 15 wherein the second capacitor electrode further comprises a third conductive layer filled atop the second barrier layer in the trench.

17. The semiconductor capacitor structure of claim 11 further comprising at least one inter-metal dielectric layer surrounding the first capacitor electrode and the second capacitor electrode.

18. A semiconductor device comprising:

a logic device disposed on a substrate;

a memory cell, having at least one transistor device, disposed on the substrate, the memory cell comprising:

a first capacitor electrode having a first conductive layer connected to the transistor device, and a second conductive layer formed above the first conductive layer, and electrically coupled to the same;

a capacitor dielectric layer formed on a side wall of the second conductive layer; and a second capacitor electrode formed on the capacitor dielectric layer and extending beyond the vertical boundary of the first conductive layer, wherein the second capacitor electrode of the memory cell is shared by a neighboring memory cell thereof without any intermetal dielectric layer interposed therebetween.

19. The device of claim 18 wherein the memory cell comprises an interconnection structure connecting the first conductive layer to the second conductive layer.

20. The semiconductor device of claim 19 wherein the interconnection structure is a single or dual damascene structure.

21. The semiconductor device of claim 18 wherein the first capacitor electrode comprises a first barrier layer formed between the second conductive layer and the capacitor dielectric layer as well as the first conductive layer.

22. The semiconductor device of claim 18 wherein the capacitor dielectric layer forms an elongated trench at a side of the second conductive layer.

23. The semiconductor device of claim 19 wherein the second capacitor electrode comprises a second barrier layer formed along the capacitor dielectric layer inside the trench.

24. The semiconductor device of claim 20 wherein the second capacitor electrode further comprises a third conductive layer filled atop the second barrier layer in the trench.

25. The semiconductor device of claim 18 further comprising at least one inter-metal dielectric layer surrounding the first capacitor electrode and the second capacitor electrode.

* * * * *